US008233252B2

(12) United States Patent
Grombach et al.

(10) Patent No.: US 8,233,252 B2
(45) Date of Patent: Jul. 31, 2012

(54) ESD PROTECTION CIRCUIT FOR LOW VOLTAGES

(75) Inventors: Peter Grombach, Heilbronn (DE); Manfred Klaussner, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 668 days.

(21) Appl. No.: 11/376,138

(22) Filed: Mar. 16, 2006

(65) Prior Publication Data

US 2006/0209479 A1 Sep. 21, 2006

(30) Foreign Application Priority Data

Mar. 18, 2005 (DE) .......................... 10 2005 013 687

(51) Int. Cl.
*H02H 9/00* (2006.01)
(52) U.S. Cl. ......................................................... 361/56
(58) Field of Classification Search ..................... 361/56
See application file for complete search history.

(56) References Cited

U.S. PATENT DOCUMENTS

| 4,987,465 | A | * | 1/1991 | Longcor et al. ............... 257/357 |
| 5,591,218 | A | * | 1/1997 | Jacobson ........................ 607/63 |
| 5,946,177 | A | | 8/1999 | Miller et al. |
| 6,452,768 | B1 | | 9/2002 | Wilkening |
| 6,501,632 | B1 | | 12/2002 | Avery et al. |
| 2003/0214769 | A1 | | 11/2003 | Nishikawa et al. |
| 2004/0109270 | A1 | | 6/2004 | Stockinger et al. |
| 2005/0083070 | A1 | * | 4/2005 | Panzer et al. ................. 324/679 |

FOREIGN PATENT DOCUMENTS

JP          03191612 A  *  8/1991

* cited by examiner

*Primary Examiner* — Rexford Barnie
*Assistant Examiner* — Ann Hoang
(74) *Attorney, Agent, or Firm* — Baker Botts L.L.P.

(57) ABSTRACT

An ESD protection circuit is provided having a first field-effect transistor, which has a first drain terminal, a first source terminal and a first control terminal, and having an input network which, in the event that a first voltage present between the first drain terminal and the first source terminal crosses a threshold value, alters a second voltage that appears between the first control terminal and the first source terminal. The input network contains a second field-effect transistor, complementary to the first field-effect transistor, having a second drain terminal, a second source terminal and a second control terminal, wherein the first drain terminal is connected to the second source terminal and, through a first resistance, to the second control terminal, and the second drain terminal is connected to the first control terminal and, through a second resistance, to the first source terminal.

11 Claims, 2 Drawing Sheets

ESD PROTECTION CIRCUIT FOR LOW VOLTAGES

This nonprovisional application claims priority under 35 U.S.C. §119(a) on German Patent Application No. DE 102005013687, which was filed in Germany on Mar. 18, 2005, and which is herein incorporated by reference.

BACKGROUND OF THE INVENTION

1. Field of the Invention

The present invention relates to an ESD protection circuit having a first field-effect transistor, which has a first drain terminal, a first source terminal and a first control terminal (gate), and having an input network which, in the event that a first voltage present between the first drain terminal and the first source terminal crosses a threshold value, alters a second voltage that appears between the first control terminal and the first source terminal.

2. Description of the Background Art

In the handling and use of integrated circuits (IC), it is necessary to protect the components and assemblies contained therein from the effects of overvoltages. In this context, overvoltages are defined as electrical signals such as those arising, for example, from the discharging of static charges, whether from persons or machine parts through an IC or from an IC through persons or machine parts. Such discharge processes are also called electrostatic discharge (ESD). When such discharge processes act on an integrated circuit, irreversible changes in its components or assemblies can occur, for example by burn-through of thin layers (thin-film burn-out), filamentation, and short-circuiting of layer junctions (junction spiking), charge carrier injection in oxide layers or oxide rupture, which under some circumstances leads to destruction of the entire IC. In this context, low voltages are defined as operating voltages for ICs on the order of less than 10 volts.

In conventional ESD protection circuits, the input network consists of two Zener diodes and an ohmic resistance. The two Zener diodes are connected in series with one another, and as a series circuit are connected in parallel with the first voltage, thus in parallel with the channel of the first field-effect transistor. The resistance is located between the first source terminal and a connection of the first control terminal to the center tap of the series circuit.

To dissipate a given ESD current or a given power in the form of a product of ESD current and ESD voltage, the first field-effect transistor must have a comparatively large channel area. In the general trend toward increasing packing densities of integrated circuits, a requirement on the part of the ESD circuit for a large area is fundamentally problematic.

SUMMARY OF THE INVENTION

It is therefore an object of the present invention to provide an ESD protection circuit that requires less area than the conventional ESD protection circuits to dissipate the ESD quantities of current and/or power mentioned above.

This object is attained by an ESD protection circuit has an input network that includes a second field-effect transistor, complementary to the first field-effect transistor, a second drain terminal, a second source terminal and a second control terminal, wherein the first drain terminal is connected to the second source terminal and, through a first resistance, to the second control terminal, and the second drain terminal is connected to the first control terminal and, through a second resistance, to the first source terminal.

By these features, during an ESD event the potential difference between the first control terminal and the first source terminal can assume nearly the value of the voltage at the first drain terminal. As a result, the second voltage (gate-source voltage) appearing between the first control terminal and the first source terminal in this process is maximized, so that the first field-effect transistor is fully driven.

In contrast, in the conventional ESD protection circuit, the voltage that arises at the first control terminal during an ESD event always differs from the voltage at the first drain terminal by the value of the breakdown voltage of one of the Zener diodes, limiting the gate-source voltage that arises and thus leading to a comparatively large internal resistance of the first field-effect transistor normalized to the channel area of the first field-effect transistor. To compensate for this, the product of the channel width and channel length of the first field-effect transistor must be larger than in the invention. Conversely, this means that the inventive ESD protection circuit requires less channel area to dissipate a given ESD power.

The second field-effect transistor can have a smaller channel area than the first field-effect transistor in order to keep the area required by the ESD protection circuit small.

Also, the second control terminal can be connected to the first source terminal through a Zener diode.

To a certain degree, this Zener diode provides the threshold value at which the ESD protection circuit switches between an active state and an inactive state. In this way the basic requirement for an ESD protection circuit, namely that it does not interfere with the circuit to be protected under normal operating voltages and only absorbs currents in the event of overvoltages, is met.

The second field-effect transistor and the Zener diode can be matched to one another such that the gate-source capacitance of the second field-effect transistor corresponds to the depletion-layer capacitance of the Zener diode.

The time behavior of the ESD protection circuit is optimized through these features, since the charge required during an ESD event for charge transfer in the gate capacitance is provided by the depletion-layer capacitance of the Zener diode with almost no delay. As a desirable result, the ESD protection circuit switches rapidly to a low-resistance state in the event of an ESD event.

Further, a third resistance can be located between the Zener diode and the first source terminal.

The voltage dropping through this third resistance when the Zener diode breaks down reduces the voltage between a gate oxide of the control terminal and a drain terminal of the second field-effect transistor and thereby reduces the danger of damage to this gate oxide during an ESD event.

The first field-effect transistor can be either an N-channel enhancement field-effect transistor or a P-channel enhancement field-effect transistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
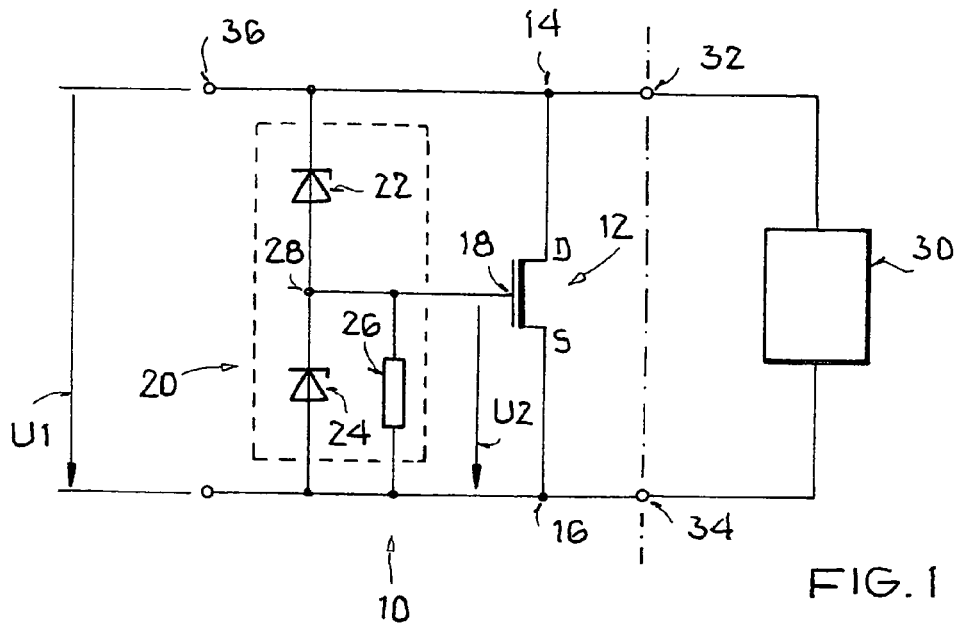
FIG. 1 illustrates a conventional ESD protection circuit, together with a circuit that is to be protected.

FIG. 1 shows an ESD protection circuit 10 with a first field-effect transistor 12, which has a first drain terminal 14, a first source terminal 16 and a first control terminal (gate) 18. Drain terminals (source terminals) of the first field-effect transistor are additionally labeled in the figures with D (S). A voltage U1 is present across the first field-effect transistor 12. When the voltage U1 crosses a threshold value during an ESD event, an input network 20 changes a second voltage U2 that arises between the first control terminal 18 and the first source terminal 16.

The input network 20 in the conventional ESD protection circuit consists of a series circuit of two Zener diodes 22, 24, and an ohmic resistance 26 that is connected to a center tap 28 of the series circuit. The series circuit is connected antiparallel to the first voltage U1 and thus in parallel to the channel of the first field-effect transistor 12, and the resistance 26 is also connected to the first control terminal 18 and the first source terminal 16.

As long as the first voltage U1 is lower than a breakdown voltage UC of the Zener diode 22, no current flows through the resistance 26, so that the potential of the first source terminal 16 appears at the first control terminal 18. The first field-effect transistor 12, implemented here as an N-channel field-effect transistor, blocks in this normal case where a circuit 30 to be protected, located between outputs 32, 34 of the ESD protection circuit 10, is operated with the voltage U1.

In contrast, if the voltage U1 rises above the breakdown voltage UC of the Zener diode 22 as a result of a positive discharge at the input 36 of the ESD protection circuit 10, the upper Zener diode 22 breaks down, so that a potential U1-UC appears at the first control terminal 18. The first field-effect transistor 12 is then driven into a conductive state and conducts the positive discharge current to a reference potential, past the circuit 30 that is to be protected. In this context, the conductivity of the first field-effect transistor 12 increases with increasing potential difference between the first control terminal 18 and the first source terminal 16. This potential difference is limited to the aforementioned value U1-UC, however, so that the first field-effect transistor 12 is never driven maximally, i.e. with the full value of the drain-source voltage U1.

Figure 2:
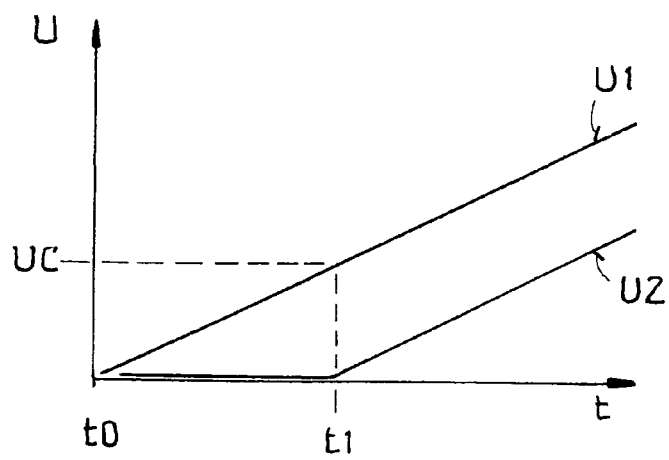
FIG. 2 is a plot over time of the voltage between the control terminal and source terminal of the first field-effect transistor of the circuit from FIG. 1 in the event of a ramp-like rise in the voltage at its drain terminal.

This is illustrated by FIG. 2, which shows a ramplike rise in the voltage U1 over the time t and a behavior of the voltage U2 occurring as a result. In this context, the voltage at the first source terminal 16 is assumed to be zero. This value acts on the first control terminal 18 between t0 and t1, so that U2 is equal to zero during this period of time. At time t1, U1 crosses the value UC, which marks the breakdown voltage of the Zener diode 22. For times t>t1, the resulting voltage U2 is then U1-UC, so that U2 never reaches the value of the drain voltage U1.

Figure 3:
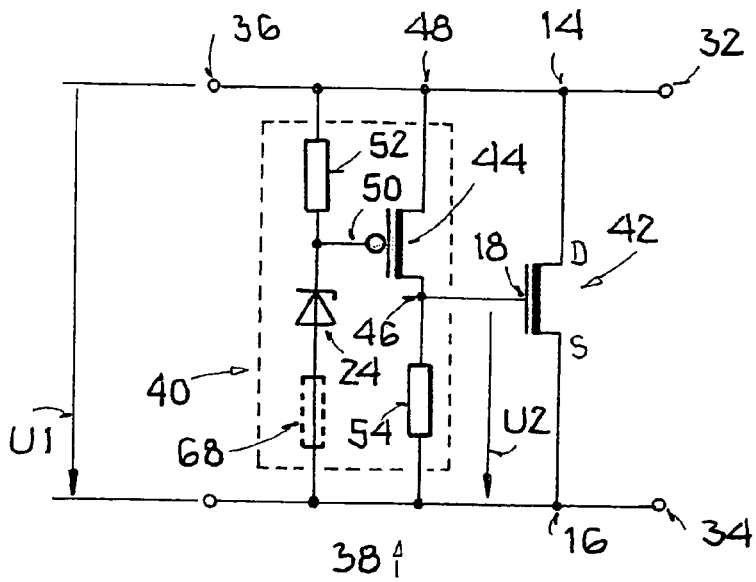
FIG. 3 shows an ESD protection circuit with an N-channel field-effect transistor as the first field-effect transistor, according to an embodiment of the present invention.

FIG. 3 shows an ESD control circuit 38 according to an embodiment of the present invention that differs from the conventional ESD protection circuit 10 by a changed input network 40. A first field-effect transistor 42 is implemented in FIG. 3 as an N-channel field-effect transistor and is labeled with its own reference symbol, since it differs from the first field-effect transistor 12 in FIG. 1 by a smaller channel area for equal ESD power. Otherwise, identical reference symbols to those in FIG. 1 label elements that are at least functionally identical. The input network 40 has a second field-effect transistor 44 that is complementary to the first field-effect transistor 42, and is thus a P-channel field-effect transistor, having a second drain terminal 46, a second source terminal 48, and a second control terminal 50. The first drain terminal 14 is connected to the second source terminal 48 and, through a first resistance 52, to the second control terminal 50. The second drain terminal 46 is connected to the first control terminal 18 and, through a second resistance 54, to the first source terminal 16.

These changes result in a function that is described below with reference to FIG. 4, which shows the behavior of the voltage U2 with a ramplike rise in the drain voltage U1 for the subject of FIG. 3. As long as U1 is less than the breakdown voltage of the diode 24, which can be, for example, a Zener diode, no current (except for a negligible reverse current) flows through the resistance 52, so that the potential U1 appears at the second control terminal 50. Thus, at most a negligible potential difference exists between the second source terminal 48 and the second control terminal 50, so that the second field-effect transistor 44 blocks. No current then flows through the second resistance 54 either, and the potential of the source terminal 16—which should also have the value zero here for purposes of illustration, without thereby limiting the invention to specific voltage values—appears at the first control terminal 18 of the first field effect transistor 42. Likewise, there is then no potential difference between the first source terminal 16 and the first control terminal 18, so that the first field-effect transistor 42 also blocks.

Not until a breakdown occurs at time t1, when U1 reaches the breakdown voltage UC of the Zener diode 24, does the voltage U1, reduced by the value of the breakdown voltage UC of the Zener diode 24, thus the voltage U1-UC, act on the control terminal 50, so that the second field-effect transistor 44, which is of the P-channel type, is switched to a low-resistance state as a result of the potential difference thus appearing between the second source terminal 48 and the second control terminal 50. Consequently, the voltage U1 acts almost undiminished on the first control terminal 18, so that the voltage U2 rises almost to the value of U1. In other words: In contrast to the first field-effect transistor 12, the first field-effect transistor 42 is fully driven and can thus dissipate a correspondingly larger ESD current. Due to the fact that the increased current conductivity resulting from the increased drive has already been taken into account in the circuit design, the first field-effect transistor 42 can dissipate the same ESD current as the first field-effect transistor 12 with a smaller channel area.

Figure 5:
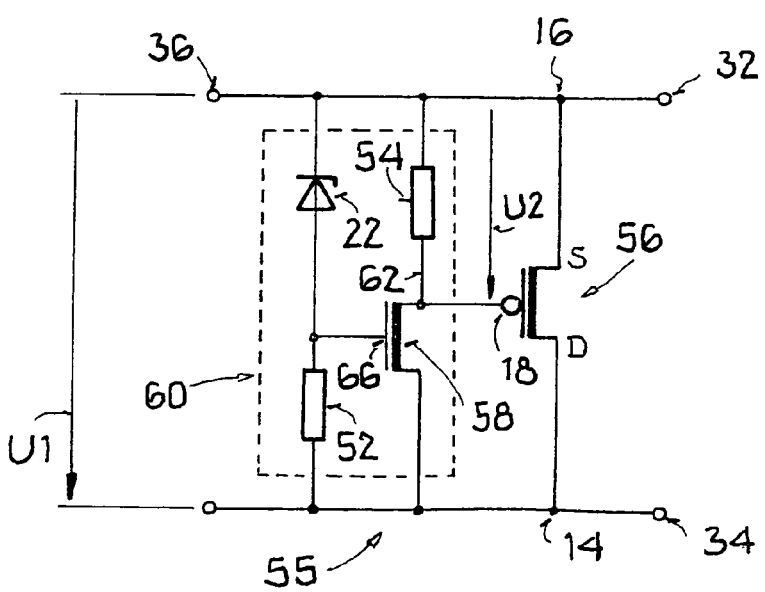
FIG. 5 shows an ESD protection circuit with a P-channel field-effect transistor as the first field-effect transistor, according to an embodiment of the present invention.

The same applies to the alternative embodiment of an ESD protection circuit 55 in FIG. 5, which uses a P-channel field-effect transistor as the first field-effect transistor 56 to dissipate an ESD current, and an N-channel field-effect transistor as the second field-effect transistor 58 in the input circuit 60. The arrangement of the first drain terminal 14 and the first source terminal 16 is adjusted in the change from N-channel to P-channel. The same applies to the tap for the voltage U2. The second N-channel field-effect transistor 58 has a second drain terminal 62, a second source terminal 64 and a second control terminal 66, with the first drain terminal 14 being connected to the second source terminal 64 and, through a first resistance 52, to the second control terminal 66. The second drain terminal 62 is connected to the first control terminal 18 and, through a second resistance 54, to the first control terminal 16.

Figure 4:
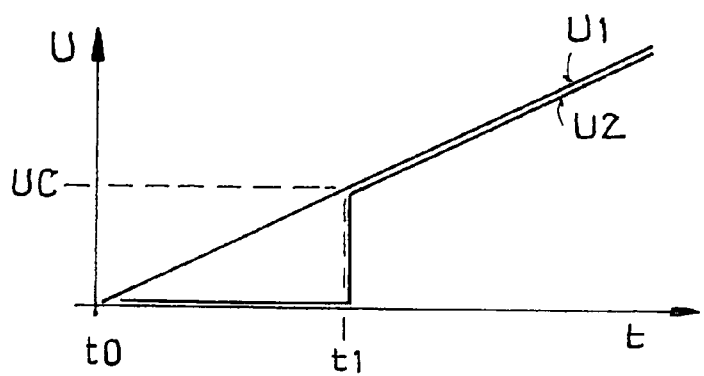
FIG. 4 shows a plot over time of the voltage between the control terminal and source terminal of the first field-effect transistor of the circuit from FIG. 3 in the event of a ramp-like rise in the voltage at its drain terminal.

The ESD protection circuit 55 in FIG. 5 exhibits the same behavior as that shown in FIG. 4: As long as U1 is less than the breakdown voltage of the Zener diode 24, no current (except for a negligible reverse current) flows through the resistance 52, so that the potential of the first source terminal 64—which is again assumed to be zero—appears at the second control terminal 66. Thus, at most a negligible potential difference exists between the second source terminal 64 and the second control terminal 66, so that the second field-effect transistor 58 blocks. No current then flows through the second resistance 54 either, and the potential U1 appears at the first control terminal 18 of the first field effect transistor 56. Likewise, there is then no potential difference between the first source terminal 16 and the first control terminal 18, so that the first field-effect transistor 56 also blocks.

Not until a breakdown occurs at time t1, when U1 reaches the breakdown voltage UC of the Zener diode 24, does the voltage U1, reduced by the value of the breakdown voltage, thus the voltage U1-UC, act on the second control terminal 66, so that the second field-effect transistor 58, which is of the N-channel type, is switched to a low-resistance state as a result of the potential difference thus appearing between the second source terminal 64 and the second control terminal 66. Consequently, a voltage that is nearly zero appears at the first control terminal 18, so that the voltage U2 rises almost to the value of U1. In other words: Here, too, in contrast to the first field-effect transistor 12, the first field-effect transistor 56 is fully driven, and can thus dissipate a correspondingly larger ESD current.

In the embodiments in FIGS. 3 and 5, a third resistance 68 can optionally be arranged between the Zener diode 24 and the first source terminal 16, as is shown in FIG. 3 in dashed lines.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A circuit comprising:
   a first field-effect transistor having a first drain terminal, a first source terminal, and a first control terminal;
   a second field-effect transistor having a second drain terminal, a second source terminal, and a second control terminal, the second field-effect transistor being complementary to the first field-effect transistor, the first drain terminal being coupled directly to the second source terminal and, through a first resistance, to the second control terminal, the second drain terminal being coupled to the first control terminal and, through a second resistance, to the first source terminal; and
   a Zener diode having a cathode coupled to the second control terminal;
   a gate-source capacitance of the second field-effect transistor corresponding to a depletion-layer capacitance of the Zener diode.

2. The circuit of claim 1, further comprising a third resistance coupling the Zener diode to the first source terminal.

3. The circuit of claim 1, wherein:
   the first transistor is an n-channel field-effect transistor; and
   the second transistor is a p-channel field-effect transistor.

4. The circuit of claim 1, wherein the second field-effect transistor has a smaller channel area than the first field-effect transistor.

5. A circuit comprising:
   an n-channel field-effect transistor having a first drain terminal, a first source terminal, and a first control terminal;
   a p-channel field-effect transistor having a second drain terminal, a second source terminal, and a second control terminal, the first drain terminal being coupled directly to the second source terminal and, through a first resistance, to the second control terminal, the second drain terminal being coupled to the first control terminal and, through a second resistance, to the first source terminal; and
   a Zener diode coupled to the second control terminal;
   a gate-source capacitance of the p-channel field-effect transistor corresponding to a depletion-layer capacitance of the Zener diode.

6. The circuit of claim 5, wherein a cathode of the Zener diode is coupled to the second control terminal.

7. The circuit of claim 5, further comprising a third resistance coupling the Zener diode to the first source terminal.

8. The circuit of claim 5, wherein the p-channel field-effect transistor has a smaller channel area than the n-channel field-effect transistor.

9. A circuit comprising:
   an n-channel field-effect transistor having a first drain terminal, a first source terminal, and a first control terminal;
   a p-channel field-effect transistor having a second drain terminal, a second source terminal, and a second control terminal, the first drain terminal coupled directly to the second source terminal and, through a first resistance, to the second control terminal, the second drain terminal coupled to the first control terminal and, through a second resistance, to the first source terminal; and
   a Zener diode coupled to the second control terminal and, through a third resistance, to the first source terminal;
   a gate-source capacitance of the p-channel field-effect transistor corresponding to a depletion-layer capacitance of the Zener diode.

10. The circuit of claim 9, wherein a cathode of the Zener diode is coupled to the second control terminal.

11. The circuit of claim 9, wherein the p-channel field-effect transistor has a smaller channel area than the n-channel field-effect transistor.

* * * * *